United States Patent [19]

Hines et al.

[11] 4,220,931

[45] Sep. 2, 1980

[54] COMPOSITE VIDEO AUTOMATIC GAIN CONTROL AMPLIFIER

[75] Inventors: William E. Hines, Chaska; Verne L. Severson, Minneapolis, both of Minn.

[73] Assignee: Northern Telecom Systems Corporation, Minnetonka, Minn.

[21] Appl. No.: 905,185

[22] Filed: May 12, 1978

[51] Int. Cl.[2] .................................................. H03G 3/20
[52] U.S. Cl. .................................... 330/284; 330/294; 358/176
[58] Field of Search ................ 330/278, 284; 358/174, 358/175, 176

[56] References Cited

U.S. PATENT DOCUMENTS 3,914,536 10/1975 Mohri et al. ................... 358/176 X Primary Examiner—James B. Mullins
Attorney, Agent, or Firm—Daniel M. Rosen

[57] ABSTRACT

An amplifier for video signals transmitted by way of coaxial cable includes synchronizing signal separating means for gating synchronizing signals to a level detecting circuit, in order to produce a control voltage. The control voltage controls the gain of an input stage of the amplifier to maintain the level of the synchronizing signals transmitted by the cable, while compensating for different attenuation which may be effected at video frequencies signal frequencies by cables of different length.

15 Claims, 14 Drawing Figures

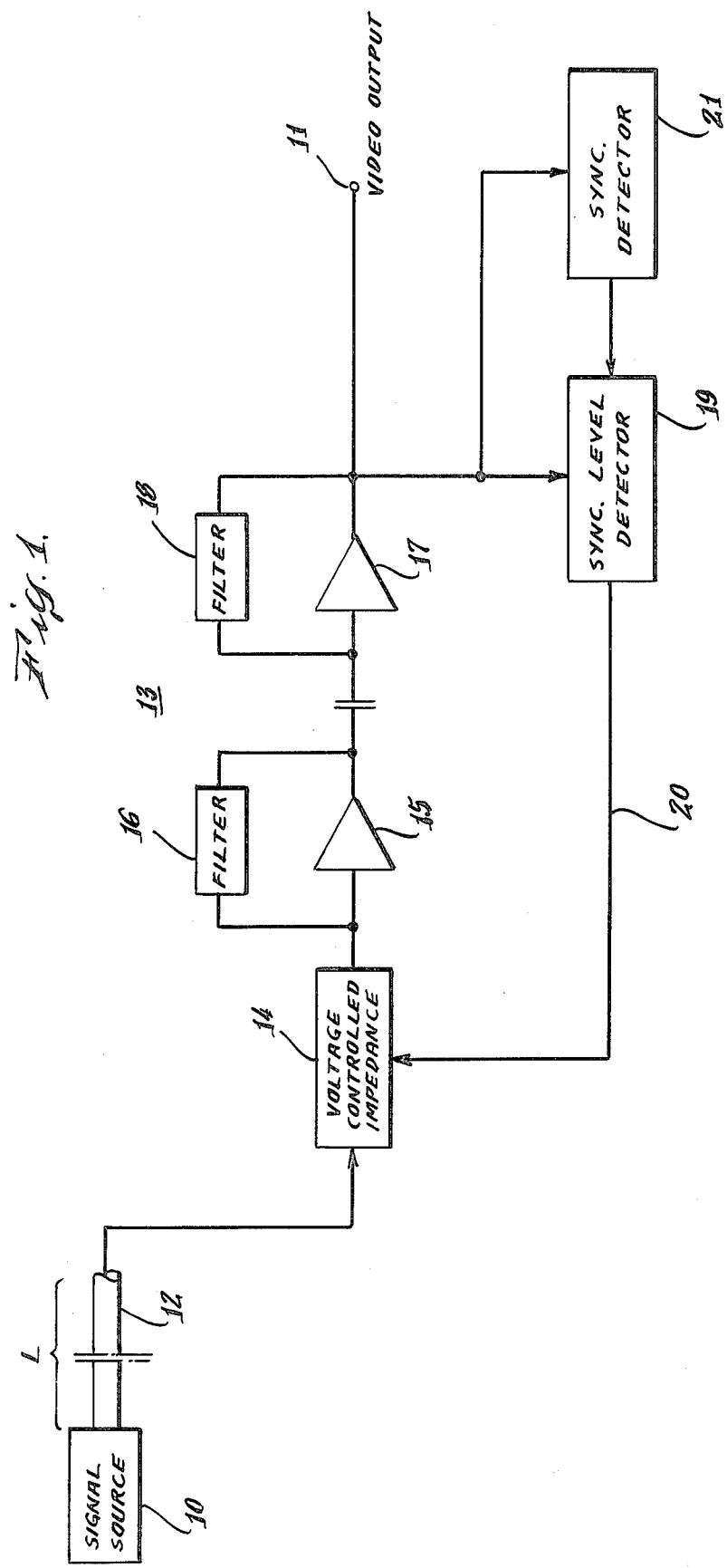

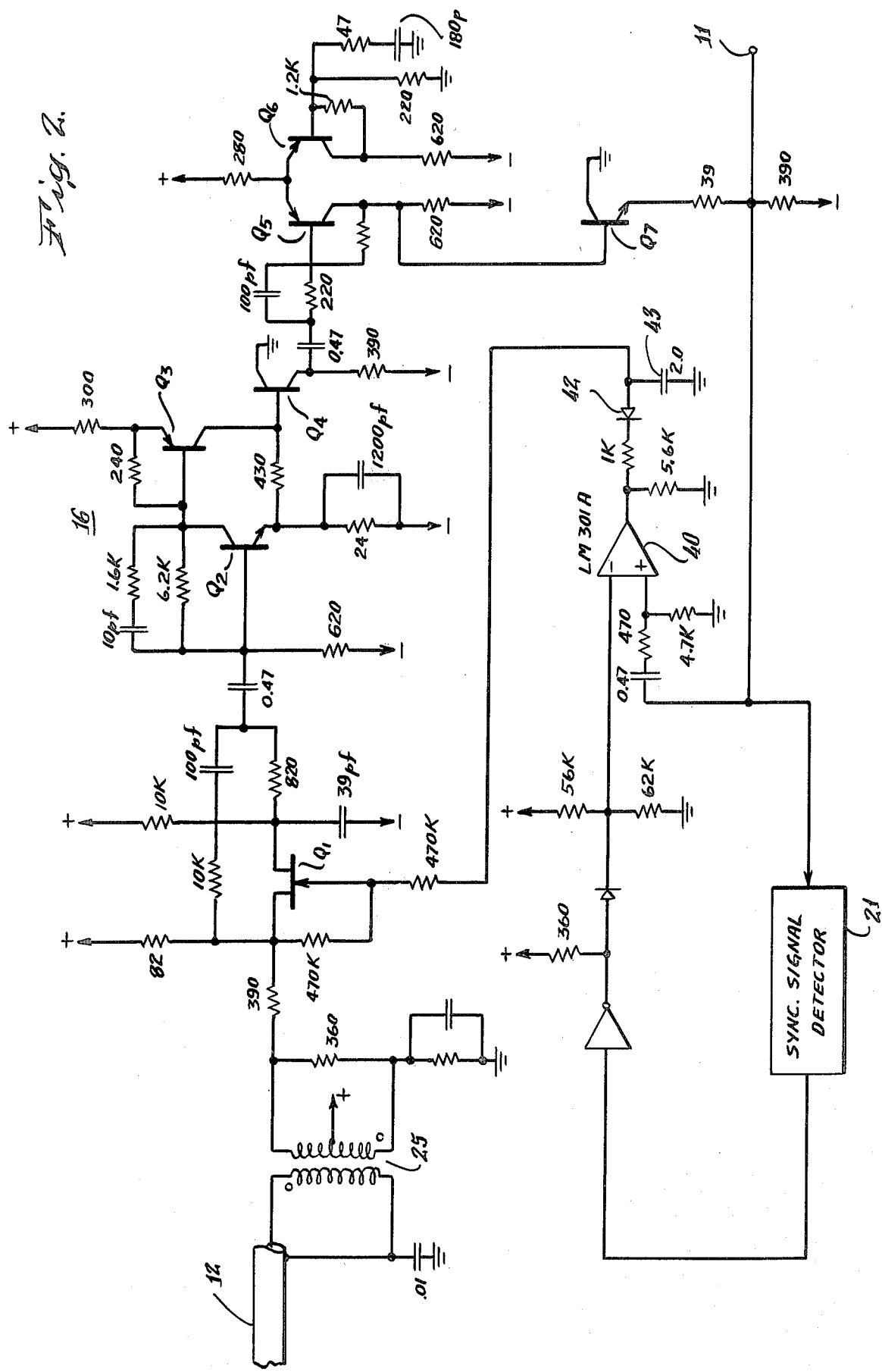

25 FEET

FREQ. RESPONSE
OF CABLE

2000 FEET

FREQ. RESPONSE
OF CABLE

FREQ. RESPONSE
OF FILTER

FREQ. RESPONSE
OF FILTER

FREQ. RESPONSE
OF STAGE TWO

FREQ. RESPONSE
OF STAGE TWO

FREQ. RESPONSE
OF TOTAL SYSTEM

FREQ. RESPONSE
OF TOTAL SYSTEM

VERT: 2.0V/DIV    HOR.: 500 μSEC/DIV

VERT: 2.0V/DIV    HOR: 500 μSEC/DIV

VERT: 1.0V/DIV    HOR: 2.0 μSEC/DIV

VERT: 1.0V/DIV    HOR: 2.0 μSEC/DIV

COMPOSITE VIDEO AUTOMATIC GAIN CONTROL AMPLIFIER

BACKGROUND OF THE INVENTION

This invention relates to the transmission of signals by way of coaxial cables or the like, and is particularly directed to systems of this type wherein the cables may have variable lengths, and the signals are composite signals which include digital signals, such as synchronizing signals, and a video component at a frequency which may be quite different than that of the repetition rate of the digital signals.

SUMMARY OF THE INVENTION

The invention is especially concerned with the transmission of complex digital type signals, for example a complex digital signal of the type wherein the video signals are in the form of video pulses for a dot matrix type of display. It is frequently necessary to convey such signals from a signal source over a cable to be displayed on a cathode ray tube, and due to the wide variation of distances over which the signals must be transmitted, it is not feasible to separately design the transmission system for each application. For example, in such a situation, the trasmission path, which is preferably a coaxial cable, may have lengths anywhere from about 25 feet to about 2,000 feet.

Coaxial cable of course attenuate signals applied thereto, in dependence upon the lengths of the cables. The attenuation for low frequencies, however, is not the same as that for high frequencies. For example, considering an RG62 coaxial cable, commonly used for digital transmission, the ratio of attenuation of the cable at 100 kilohertz and 14 megahertz is about 1:3. These frequencies, incidentally, correspond to the synchronization signal pulse of a repetition rate and video signal frequency of a typical example of signal frequencies with which the present invention is concerned.

It may of course be possible to provide compensating systems for manually controlling the gain of an amplifier in accordance with the length of a cable, while also adjusting a tuning circuit also in dependence upon the length of the cable. Such adjustments in the installation of equipment are undesirable, however, since improper settings may be made or the adjustment may be overlooked entirely, to the detriment of the displayed image.

In one system of this type, employing feedback control, as disclosed for example in U.S. Pat. No. 3,764,745, a control voltage for the entire range of input frequencies is developed by averaging the amplitude of all frequency components within the range of interest. Such a system is also not useful for transmission system adapted to transmit composite digital signal, since the average amplitude may vary as a function of attenuation of the signals, as well as due to variation of the energy content of the video signal itself.

It will also provide no solution to the problem, if one were to separate from the composite signal, signals only of the frequency of the synchronizing signals, by various filtering techniques, since the energy of signals at the synchronization signal frequency varies as a function of the video signal content, as well as a function of the synchronizing signal components themselves.

The difficulty of providing a suitable control voltage for a gain controlled amplifier is further evident from FIG. 4 of the present application, which shows cathode ray oscilloscope displays of signals of the type with which the present invention is concerned. Thus, FIG. 4A is an oscilloscope showing of a composite video signal of the above frequency characteristics, at the output of an RG-62 cable 25 feet in length, and FIG. 4B is a showing of the same signal at the output of a cable of the same type but having a length of 2,000 feet. FIGS. 4C and 4D correspond to FIGS. 4A and 4B, respectively, but are on a larger scale in order to show the transition regions between the synchronization pulses and the video pulses, in a clearer manner. In each of these showings the synchronization pulses are negative going pulses at the left of the images, and the video signal pulses appear at the right. From these images, it is evident that the analog separation of synchronizing signals and video signal frequency pulses as mentioned in previous invention, to provide a control voltage that has a meaningful relation to cable length, could not be effected. It is further evident that the attenuation of the synchronization signals and the video signal pulses has not been equal, in the two different cases.

The present invention is therefore directed to a system for overcoming the disadvantages of a known system, as above discussed.

Briefly stated, in accordance with the invention, an amplifing system is provided having an input stage with a control voltage terminal, and having a transfer function whose frequency response varies as a given function of a control voltage applied to the terminal. The amplifier further has a stage for deriving a control voltage for the input stage dependent upon the level of the synchronization pulses, but independently of the video frequency pulse content.

The development of the control voltage at the output of the level detector is preferably effected by gating the output of the amplifier to the level detector at times only at which the video frequency pulses themselves do not occur. This may be effected by the derivation of synchronizing signal pulses from the output of the amplifier, to control the application of signals to the signal level detector for the production of the control voltage.

The input stage of the amplifier, adapted to be connected to the output of a coaxial cable of variable length, may comprise a variable impedance in the form of an FET used as a voltage controlled resistor. This input stage may further comprise, for example, an active filter, whereby the FET impedance serves as the frequency determining element for the input stage of amplification. As a consequence, the gain of the input stage is varied as a function of the control voltage, and the frequency characteristics of the input stage are also varied as a function of the control voltage. It is thereby apparent that the components employed for the FET amplifier, and the active filter, may be selected to match the attenuation ratio of the coaxial cable, so that the effects of the cable with respect to overall attenuation and differences of attenuation at different frequencies may be compensated, such that the amplifier output is independent of coaxial cable length.

In the consideration of the invention, it is important to realize that the amplifier is employed to reconstruct a triple level (minus, zero, plus) digital type signal, as opposed to an analog signal for which amplifiers of the prior art have been designed. The system in accordance with the present invention, provides feedback which ensures that synchronization pulses of determined amplitude occur at determined times, (for example, during vertical retrace when the pulses are unaffected by video content) and that the gain of the amplifier during the remainder of the time is based upon the gain occurring during the vertical retrace. The control voltage is not dependent upon the video signal pulses themselves, but is employed by virtue of the variable transfer function of the input stage of the amplifier, to compensate for the complex transmission function of the coaxial cable, so that the composite output signal is produced faithfully independently of the length of the cable. As a consequence, installation of video systems may readily be effected by inexperienced personnel, without the necessity for any adjustment with respect to length of the cable or the like. This result is effected with a minimum number of components, and in an inexpensive manner.

BRIEF DESCRIPTION OF THE DRAWINGS

In order that the invention will be more clearly understood, it will now be disclosed in greater detail with reference to the accompanying drawings, wherein:

FIG. 1 is a simplified block diagram of a system in accordance with the invention;

FIG. 2 is a circuit diagram of one embodiment of a circuit in accordance with the invention;

DETAILED DESCRIPTION OF THE PREFERRED EMBODIMENT

Figure 3A:
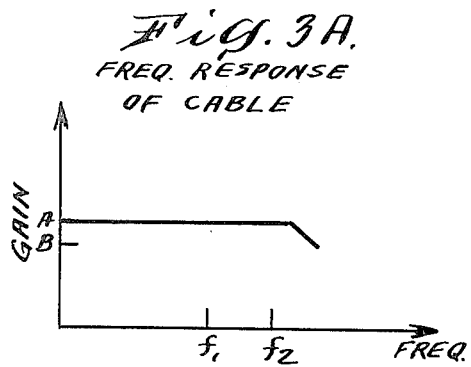
FIGS. 3A–3H are illustrations of the transmission functions of various portions of the system in accordance with the invention, for the purpose of illustration.

Referring now to the drawings, and more in particular to FIG. 1, it is frequently desired to interconnect a video signal source 10 to a video output terminal 11, by way of a cable, such as a coaxial cable 12, and on many occasions the signal source 10 must be of a general design, such that its signal output characteristics are not specifically tailored to the length L of the cable. In other words, coaxial cables are known to attenuate signals applied thereto, and it is known that such attenuation is frequency dependent. The system of FIG. 1, in accordance with the invention, is thereby directed to the provision of an output amplifying circuit, generally indicated by the reference numeral 13, which enables the use of a signal source of general design without regard to the length of the cable interconnecting the source with the output video terminal. In other words, the amplifing system 13 in accordance with the invention is adapted to compensate for the attenuation of signals of all frequencies of concern by the cable, even though the transmission characteristics of the cable differ at different frequencies.

The invention is particularly concerned with the transmission of video signals, wherein the composite signals are of very wide frequency range. For example, in one system, the video information signals may be generally in the 15 megahertz region, with synchronizing signal components being in the 100 kilohertz frequency region. These figures have been chosen since the circuit of FIG. 2, to be hereinafter described, has been designed for use with conposite signals of these ranges, although it will be apparent that the system may be modified for use with video signals of other frequency range.

Referring again to FIG. 1, the amplifier system of the invention is adapted to be connected, preferably, to the output of the cable, with the composite signal being initially applied from the center conductor of the cable to a voltage controlled impedance 14. In the preferred embodiments of the invention, the impedance 14 is resistive in nature, although it will be apparent that other voltage variable impedances may be employed, as long as they are adaptable to properly affect the gain and frequency characteristics of a folloding amplifier.

The impedance 14 is connected to the input of an amplifier 15, serving as a filter, a feedback path 16 identified as a filter indicating this function of the amplifier. The amplifier 15 and filter 16 combination may be in the form of an active filter, and this circuit has frequency/gain characteristics that are dependent upon the source impedance 14 which, as above discussed, may be resistive in nature.

The output of the amplifier 15 may be applied, if necessary, to a further amplifier 17, which may also be connected as a filter, having a feedback path 18 identified as a filter to show this function. This combination of elements need not be designed to have controllable gain/frequency characteristics, and hence the output of the first filter may constitute a substantially constant source impedance for the second filter. The amplifier 17 may be an active filter. The output of the amplifier 17 may be connected directly, or by way of other amplifiers, filters or the like, if desired, to the output terminal 11, although it will be evident that variable transfer functions of such additional circuits may not be automatically compensated by the system of the invention.

In accordance with the invention, the output of the last stage of amplification, i.e., such as the amplifiers 17, is applied to a synchronization signal level detector 19, in order to produce a control voltage or control function on its output line 20 that represents the amplitude of the synchronization signals, such as horizontal synchronization signals. It will of course be apparent that other synchronization signals or pilot signals on the composite input may be employed to derive the control voltage. In this regard, it is necessary to render the level detector 19 operative to provide its output signal only at times corresponding to the occurrence of the synchronizing signals, i.e., in the absence of the high frequency component signals, and for this purpose a synchronization signal detector 21 may be connected to gate the level detector 19. The synchronizing signal detector 21 may derive the synchronizing signal from the output of the amplifier 17, either directly or indirectly, in order to enable production of the gating signal. The synchronizing signal detector 21 may, for example, be of the form generally employed in television receivers.

The control voltage output of the level detector 19 is applied to control the impedance of the voltage controlled impedance 14.

In the system of FIG. 1, it is evident that the synchronizing signals and video component of the composite signal are attenuated by the cable 12, and that the attenuation, aside from being dependent upon the length of the cable, is also dependent upon the frequency. The synchronizing signals are selected at the output of the amplifier 17, in order to provide a control voltage dependent upon the amplitude of the synchronizing signals. Since this voltage is employed to control the impedance of the voltage variable impedance 14, and the gain of the first amplifier/filter 15 is dependent upon this impedance, the system of FIG. 1 thereby automatically compensates for the gain loss of the synchronizing signals in the cable. In addition, since the transfer function of the filter is also dependent upon the source impedance, it is evident that the filter and impedance may be matched so that the transfer function of the filter additionally compensates for the different attenuation of other frequencies, such as frequencies of the video component. In this manner, in accordance with the invention, the control voltage for signals of one frequency may be employed to control the gain of signals of another frequency, so that the amplitude of the various signal components of the composite signal at the output terminal 11 will be substantially independent of the length of the cable 12.

A preferred embodiment of the invention is illustrated in greater detail in FIG. 2, wherein the signals transmitted by the coaxial cable are shown to be applied to an input transformer 25. The input amplifier, corresponding to the amplifier 15 of FIG. 1, is comprised of the transistors Q2 and Q3, with the feedback circuit being generally denoted by the reference numeral 16. The signals from the transformer 25 to the amplifier are applied by way of the source-drain path of FET Q1, whereby Q1 and its associated circuit elements comprises a variable source impedance for the amplifier comprised of the transistors Q2 and Q3. Typical values of components for the above described operating parameters are provided on the figure, and it is hence unnecessary to repeat these figures here. As above discussed, this porition of the circuit constitutes an active filter, fabricated in accordance with known design techniques for active filters.

Figure 3E:
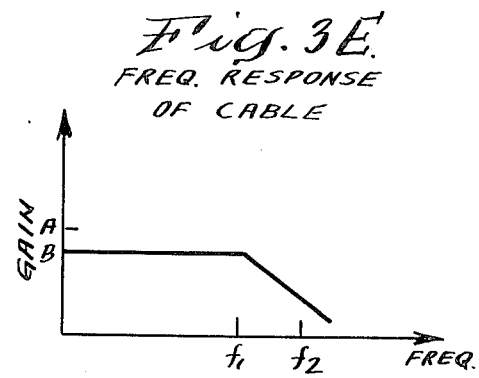
Figure 3B:
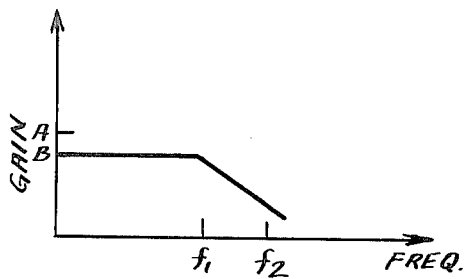
Figure 3F:
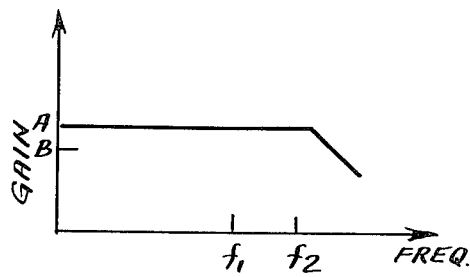

The characteristics of this portion of the circuit may be more clearly seen by reference to FIGS. 3A, 3B, 3E and 3F. In these figures, the frequencies f1 and f2 correspond to the design frequencies of 100 kilohertz and 14 megahertz respectively. FIGS. 3A and 3B further correspond to a case wherein the coaxially cable 12 was of the type RG-62, and had a length of 25 feet. FIGS. 3E and 3F, however, correspond to the condition wherein the cable of this type connected to the amplifier system of the invention had a length of 2,000 feet.

Comparing FIGS. 3A and 3E, it is evident that, when only 25 feet of cable are employed, the roll off frequency of the cable is in excess of 14 megahertz, whereas when 2,000 feet of cable are employed, the amplitude of the signals is substantially attenuated (as shown generally by the gain levels A and B, and the roll off frequency has been reduced to substantially 100 kilohertz. FIGS. 3A and 3E thus correspond to the relative signals appearing at the input of the amplifier system.

A cable of 25 feet in length thus does not substantially attenuate the 100 kilohertz signals, so that the control voltage derived from the synchronizing signals is at a level to effect a substantial reduction in the gain of the 100 kilohertz signals, as shown in FIG. 3B. The source impedance of the amplifier, in response to control voltages of this level, however, affects the transmission function of the amplifier so that the roll off frequency is substantially at 100 kilohertz. On the other hand, as shown in FIG. 3F, due to the attenuation of the 100 kilohertz signals for the longer cable, the amplitude of the control voltage is changed to reduce the source resistance to the amplifier, whereby the gain of the circuit at 100 kilohertz is increased. This increase, also due to the change in the source impedance value, also controls the transfer function of the amplifier, so that the roll off frequency is now in excess of 14 megahertz.

Figure 3C:
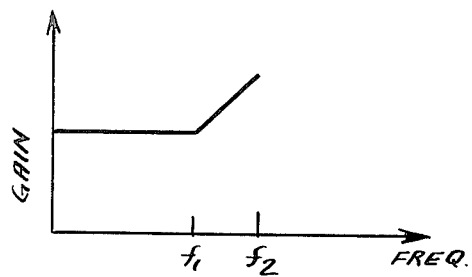
Figure 3G:
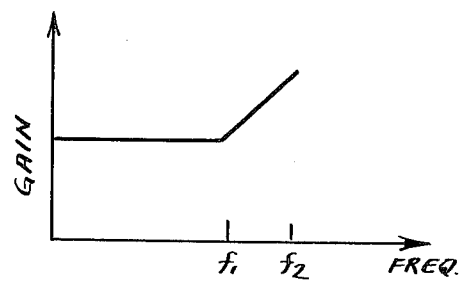

Referring again to FIG. 2, the output of the first filter-amplifier is coupled by way of emitter follower Q4, to a second amplifier including transistors Q5 and Q6. Since the source impedance of this amplifier is constant, the transfer function thereof will not vary as a function of the control voltage, as shown in FIGS. 3C and 3G for the above described example of 25 feet and 2,000 feet respectively of cable. The output of the amplifier including transistor Q5 and Q6 may be connected to the output terminal 11, for example, by way of emitter follower Q7.

Figure 3D:
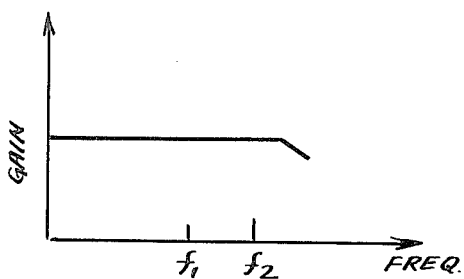
Figure 3H:
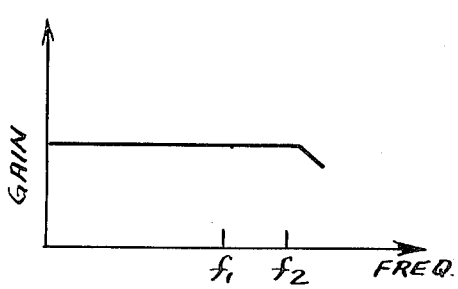
Figure 4A:
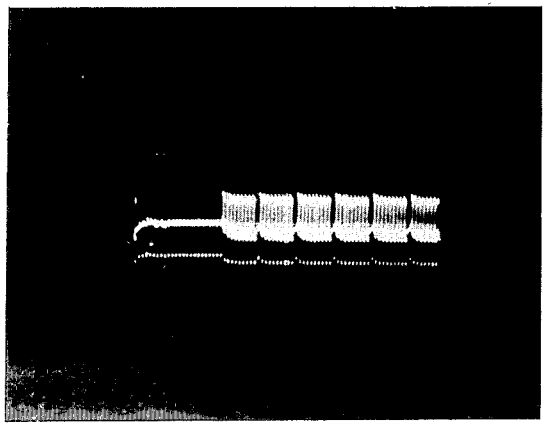
FIGS. 4A–4D are oscilloscope patterns of signals at the output of cables of different length, for illustrating the types of signals with which the present invention is concerned.
Figure 4B:
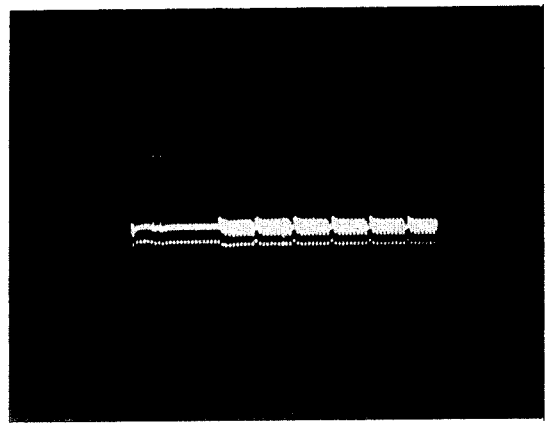
Figure 4C:
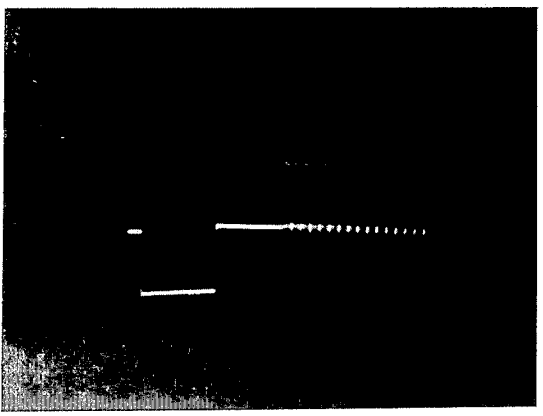
Figure 4D:
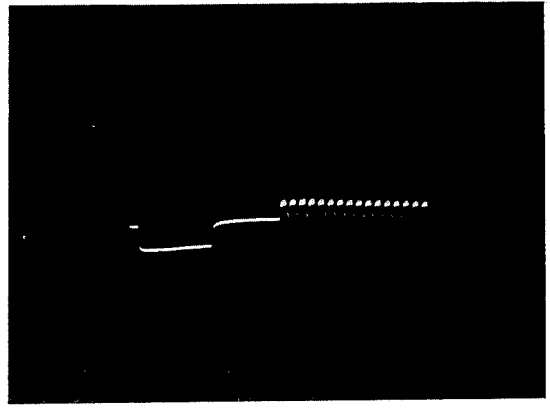

Referring now to FIGS. 3D and 3H, which represent the composite characteristics of FIGS. 3A, 3B and 3C, and 3E, 3F and 3G respectively, it is evident that the system in accordance with the invention has compensated for the transmission characteristics of the cable so that the output of the overall system is substantially independent in both gain and frequency characteristics, of the length of the cable.

In the system of FIG. 2, the synchronization signal level detector is comprised of operational amplifier 40, the composite output signals being applied to the noninverting input of the amplifier 40. This amplifier is gated by the application of the output of the synchronization signal detector 21 to the inverting input of the amplifier 40. The output of the amplifier 40 thus varies in response to the amplitude of synchronization signals only during the time of no video signal transmission (for example, during vertical retrace). These signals are applied by way of diode 42 to integrating capacitor 43 of relatively large value, so that the voltage at the control input of the voltage variable inpedance, i.e., at the gate of the FET Q1, remains substantially constant under given operating conditions. The control voltage circuit, including capacitor 43, has a charging time constant that is much smaller than the discharge time constant. The charging time constant is small to allow rapid response of the control voltage circuit to the synchronization pulses during the limited time the control voltage circuit is enabled on. The discharge time constant is very high so that the control voltage generated can be retained until the next time the circuit is enabled on (during vertical retrace). Thus, in the circuit illustrated in FIG. 2, a time constant of about 2 seconds is employed since this is much longer than one CRT refresh time. Such a long time constant is of course quite adequate from the standpoint of the objective of the present invention, as above discussed, since the transfer function control is primarily to compensate for differences in cable length, and cable lengths are only infrequently varied. The invention does, however, have the advantage that this factor may no longer be considered in the interconnection of a cable between systems.

While the invention has been disclosed and described with reference to a single embodiment, it will be apparent that variations and modifications may be made therein, and it is intended in the following claims to cover each such variation and modification as follows within the true spirit and scope of the invention.

What is claimed is:

1. An amplifier for composite input signals having a periodically occurring digital component at a given repetition rate and video signals with frequency components substantially different from said repetition rate, said amplifier having an input stage for receiving said input signals, an output stage, means coupled to said output stage for providing a control voltage that is dependent upon the amplitude of said digital component and is independent of the amplitude of said video signals, said input stage comprising an amplifier with a control voltage terminal coupled to receive said control voltage and having a gain and frequency response that varies as a given function of a control voltage applied to said terminal throughout the frequency range of said video signals and digital component.

2. The amplifier of claim 1 wherein said control voltage providing means comprises gate control means, and a high discharge time constant circuit connected to the output of said gate control means.

3. The amplifier of claim 2 wherein said high time constant is much greater than one CRT refresh time.

4. The amplifier of claim 1 wherein said means providing a control voltage comprises means coupled to said upward stage for selecting said digital component from the output of said output stage, and means deriving said control voltage from said digital component.

5. An amplifier for composite input signals having a periodically occurring digital component at a given repetition rate and video signals with frequency components substantially different from said repetition rate, said amplifier having an input stage for receiving said input signals, an output stage, means coupled to said output stage for providing a control voltage that is dependent upon the amplitude of said digital component and is independent of the amplitude of said video signals, said input stage comprising an amplifier with a control voltage terminal and having a gain and frequency response that varies as a given function of a controlled voltage applied to said terminal, said input stage comprising an input terminal, an active filter, and a voltage variable impedance connected between said input terminal and said active filter.

6. The amplifier of claim 5 wherein said voltage variable impedance comprises an FET having a source-drain path connected between said input terminal and said active filter, said control voltage terminal being coupled to the gate of said FET.

7. The amplifier of claim 6 wherein said active filter comprises a transistor amplifier having a feedback impedance.

8. An amplifier for composite input signals having a periodically occurring digital component at a given repetition rate and video signals with frequency components substantially different from said repetition rate, said amplifier having an input stage for receiving said input signals, an output stage, means coupled to said output stage for providing a control voltage that is dependent upon the amplitude of said digital component and is independent of the amplitude of said video signals, said input stage comprising an amplifier with a control voltage terminal and having a gain and frequency response that varies as a given function of a control voltage applied to said terminal, said control voltage providing means comprising gate control means, and a high dischage time constant circuit connected to the output of said gate control means, said gate control means comprising an operational amplifier, the output of said output stage being connected to the non-inverted input of said operational amplifier, and synchronization signal detector means coupled to said output stage for applying selected signals to the inverted input of said operational amplifier.

9. The amplifier of claim 8 wherein said input stage comprises an active filter.

10. A transmission system for composite video signals having synchronization signal portions and video portions occurring at different times, said system comprising a coaxial cable, an amplifier connected to the output end of said cable and having an input stabe with a control voltage terminal, means coupled to the output of said amplifier for deriving a control voltage responsive only to the amplitude of said synchronization signal, and means applying said control voltage to said input stage, the transfer function of said input stage being responsive to said control voltage whereby the overall level of synchronization signals and video portion is independent of the length of said cable.

11. The system of claim 10 wherein said cable has a length between 25 and 2,000 feet.

12. The system of claim 10 wherein said coaxial cable has a transfer function wherein the attentuation with length varies as a function of frequency, and said transfer function of said input stage is varible as a function of said control voltage to compensate for the attentuation of coaxial cable at all ranges of frequency components of said composite video signal.

13. The transmission system of claim 10 wherein said input stage comprises a voltage controlled impedance.

14. A transmission system for composite video signals having synchronization signal portions and video portions occurring at different times, such system comprising a coaxial cable, an amplifier connected to the output end of said cable and having an input stage with a control voltage terminal, means coupled to the output of said amplifier for deriving a control voltage responsive only to the amplitude of said synchronization signal, and means applying said control voltage to said input stage, the transfer function of said input stage being responsive to said control voltage whereby the overall level of sychronization signals and video portion is independent of the length of said cable, said input stage comprising a series resistance formed by the source-drain path of an FET amplifier, and an active filter, said FET comprising the input impedance of said active filter, and further comprising means applying said control voltage to the gate of said FET, said means producing said control voltage comprising gate control means, means applying the output of said system to said gate control means, and synchronization signal detecting means connected to control said gate control means, whereby the output of said gate control means corresponds substantially only to the level of synchronization signals at the output of said cable.

15. The system of claim 14 wherein said gate control means comprises an operational amplifier.

* * * * *